United States Patent
Lasser

(10) Patent No.: US 9,489,300 B2
(45) Date of Patent: Nov. 8, 2016

(54) DATA ENCODING FOR NON-VOLATILE MEMORY

(71) Applicant: SANDISK TECHNOLOGIES INC., Plano, TX (US)

(72) Inventor: Menahem Lasser, Kohav-Yair (IL)

(73) Assignee: SANDISK TECHNOLOGIES LLC, Plano, TX (US)

( * ) Notice: Subject to any disclaimer, the term of this patent is extended or adjusted under 35 U.S.C. 154(b) by 177 days.

(21) Appl. No.: 14/103,565

(22) Filed: Dec. 11, 2013

(65) Prior Publication Data

US 2014/0379962 A1  Dec. 25, 2014

Related U.S. Application Data

(63) Continuation-in-part of application No. 14/100,546, filed on Dec. 9, 2013, which is a continuation-in-part of application No. 13/921,626, filed on Jun. 19, 2013, now Pat. No. 9,117,520.

(51) Int. Cl.
  *G06F 12/02* (2006.01)
  *G11C 14/00* (2006.01)
  *G11C 13/00* (2006.01)

(52) U.S. Cl.
  CPC ....... *G06F 12/0246* (2013.01); *G11C 13/0035* (2013.01); *G11C 13/0069* (2013.01); *G11C 2013/0088* (2013.01)

(58) Field of Classification Search
  CPC .. G06F 2212/206; G06F 12/00; G06F 12/02; G06F 12/0246; G06F 12/063; G06F 13/4234; G06F 2212/1024; G06F 3/0611; G06F 3/0638

USPC ............................................. 711/103, 170, 5
See application file for complete search history.

(56) References Cited

U.S. PATENT DOCUMENTS

| | | | |
|---|---|---|---|
| 5,787,487 A | 7/1998 | Hashimoto et al. | |
| 5,893,097 A | 4/1999 | Hayata et al. | |
| 6,728,825 B1 | 4/2004 | Norman | |
| 6,862,235 B2 | 3/2005 | Sakata et al. | |
| 6,957,307 B2 | 10/2005 | Rieseman et al. | |
| 7,477,072 B1 * | 1/2009 | Kao ................ | H03K 19/17752 326/40 |
| 8,406,053 B1 | 3/2013 | Dutta et al. | |
| 8,422,668 B1 | 4/2013 | Thichina | |

(Continued)

FOREIGN PATENT DOCUMENTS

| | | |
|---|---|---|
| KR | 20120074818 A | 6/2012 |
| WO | 2010092536 A1 | 8/2010 |

OTHER PUBLICATIONS

Notice of Allowance and Fee(s) Due mailed May 5, 2015 in U.S. Appl. No. 13/921,566, 14 pages.

(Continued)

*Primary Examiner* — Tuan Thai
*Assistant Examiner* — Edward Waddy, Jr.
(74) *Attorney, Agent, or Firm* — Toler Law Group, PC

(57) ABSTRACT

A data storage device includes a memory and a controller. Mapping circuitry is configured to apply a mapping to received data to generate mapped data to be stored into the memory. The mapping is configured to increase average reliability by reducing an average number of state changes of storage elements per write operation and to reduce average write time by reducing a number of operations for storing the mapped value into the storage elements.

46 Claims, 8 Drawing Sheets

(56) References Cited

U.S. PATENT DOCUMENTS

| | | | |
|---|---|---|---|
| 8,571,790 B2 | 10/2013 | Tanabe et al. | |
| 8,644,067 B2 | 2/2014 | Jeon | |
| 8,780,620 B2 | 7/2014 | Jiang et al. | |
| 8,838,881 B2 | 9/2014 | Patapoutian et al. | |
| 8,880,782 B2* | 11/2014 | Ordentlich | 365/148 |
| 8,966,205 B1 | 2/2015 | Lo et al. | |
| 9,015,405 B2 | 4/2015 | Ordentlich et al. | |
| 2002/0194438 A1 | 12/2002 | Lasser | |
| 2003/0208505 A1 | 11/2003 | Mullins et al. | |
| 2004/0042292 A1 | 3/2004 | Sakata et al. | |
| 2004/0080979 A1 | 4/2004 | Park | |
| 2004/0205306 A1 | 10/2004 | Janas et al. | |
| 2005/0144368 A1 | 6/2005 | Chung et al. | |
| 2005/0213393 A1 | 9/2005 | Lasser | |
| 2007/0038971 A1* | 2/2007 | Hiramatsu | G06F 15/7867 326/38 |
| 2008/0140692 A1 | 6/2008 | Gehring et al. | |
| 2008/0158948 A1 | 7/2008 | Sharon et al. | |
| 2008/0189490 A1 | 8/2008 | Cheon et al. | |
| 2008/0228995 A1 | 9/2008 | Tan et al. | |
| 2009/0106282 A1 | 4/2009 | Silverman | |
| 2009/0109788 A1* | 4/2009 | Moon | G06F 12/0246 365/230.03 |
| 2009/0132758 A1 | 5/2009 | Jiang et al. | |
| 2009/0193184 A1 | 7/2009 | Yu et al. | |
| 2009/0213653 A1 | 8/2009 | Perlmutter et al. | |
| 2009/0268532 A1* | 10/2009 | De Ambroggi | G06F 12/0238 365/189.16 |
| 2010/0082885 A1 | 4/2010 | Litsyn et al. | |
| 2010/0125701 A1 | 5/2010 | Park | |
| 2011/0051492 A1* | 3/2011 | Toda | G11C 5/025 365/148 |
| 2011/0058431 A1 | 3/2011 | Gunwani et al. | |
| 2011/0082967 A1 | 4/2011 | Deshkar et al. | |
| 2011/0093652 A1 | 4/2011 | Sharon et al. | |
| 2011/0125975 A1* | 5/2011 | Kim | G06F 12/0607 711/157 |
| 2011/0167192 A1 | 7/2011 | Iyer et al. | |
| 2011/0170346 A1 | 7/2011 | Nagai et al. | |
| 2011/0258370 A1 | 10/2011 | Sharon et al. | |
| 2012/0023282 A1 | 1/2012 | Rub | |
| 2012/0054146 A1 | 3/2012 | Gupta et al. | |
| 2012/0096234 A1 | 4/2012 | Jiang et al. | |
| 2012/0233396 A1* | 9/2012 | Flynn | G06F 3/061 711/108 |
| 2012/0317459 A1 | 12/2012 | Yeo et al. | |
| 2013/0024605 A1 | 1/2013 | Sharon et al. | |
| 2013/0031313 A1 | 1/2013 | Ryan et al. | |
| 2013/0038960 A1 | 2/2013 | Song | |
| 2013/0054876 A1* | 2/2013 | Varanasi | G11C 16/102 711/103 |
| 2013/0073821 A1 | 3/2013 | Flynn et al. | |
| 2013/0073822 A1 | 3/2013 | Sandel et al. | |
| 2013/0097403 A1* | 4/2013 | Zheng | G06F 12/1036 711/206 |
| 2013/0139023 A1 | 5/2013 | Han et al. | |
| 2013/0148400 A1 | 6/2013 | Murooka | |
| 2013/0262903 A1 | 10/2013 | Thevar | |
| 2013/0279249 A1 | 10/2013 | Yun et al. | |
| 2013/0297986 A1* | 11/2013 | Cohen | G06F 11/1012 714/763 |
| 2013/0318420 A1* | 11/2013 | Seol | G06F 11/1008 714/773 |
| 2013/0346671 A1 | 12/2013 | Michael et al. | |
| 2014/0006898 A1 | 1/2014 | Sharon et al. | |
| 2014/0047222 A1 | 2/2014 | Wang | |
| 2014/0089560 A1* | 3/2014 | Sunkavalli | G06F 12/0246 711/103 |
| 2014/0189269 A1 | 7/2014 | Hughes et al. | |
| 2014/0351501 A1* | 11/2014 | Davis | G06F 11/1048 711/105 |
| 2014/0379961 A1 | 12/2014 | Lasser | |
| 2014/0379962 A1 | 12/2014 | Lasser | |

OTHER PUBLICATIONS

Notice of Allowance and Fee(s) Due mailed May 5, 2015 in U.S. Appl. No. 13/921,626, 15 pages.
Notice of Allowance and Fee(s) Due mailed Oct. 21, 2014 in U.S. Appl. No. 13/921,626, 2 pages.
Non-Final Office Action mailed Mar. 17, 2015 in U.S. Appl. No. 14/100,498, 5 pages.
International Search Report and Written Opinion of the International Searching Authority (EPO) for International Application No. PCT/US2014/043112, mailed Dec. 16, 2014, 17 pages.
Non-Final Office Action mailed Jan. 5, 2015 in U.S. Appl. No. 13/921,566, 6 pages.
Non-Final Office Action mailed Jan. 5, 2015 in U.S. Appl. No. 13/921,626, 6 pages.
Invitation to Pay Additional Fees and, Where Applicable, Protest Fee and Partial International Search Report mailed Oct. 9, 2014 in International Application No. PCT/US2014/043112, 6 pages.
Notice of Allowance and Fee(s) Due mailed Aug. 20, 2014 in U.S. Appl. No. 13/921,566, 8 pages.
Notice of Allowance and Fee(s) Due mailed Aug. 22, 2014 in U.S. Appl. No. 13/921,626, 8 pages.
Lasser, "Data Encoding for Non-Volatile Memory", U.S. Appl. No. 14/100,498, filed Dec. 9, 2013, 101 pages.
Lasser, "Data Encoding for Non-Volatile Memory", U.S. Appl. No. 14/103,656, filed Dec. 11, 2013, 42 pages.
Lasser, Menahem. "Data Encoding for Non-Volatile Memory," U.S. Appl. No. 13/921,566, filed Jun. 19, 2013, 67 pages.
Lasser, Menahem. "Data Encoding for Non-Volatile Memory", U.S. Appl. No. 13/921,626, filed Jun. 19, 2013, 64 pages.
Notice of Allowance and Fee(s) Due mailed Jul. 28, 2015 in U.S. Appl. No. 14/100,498, 15 pages.
Non-Final Office Action mailed Nov. 25, 2015 in U.S. Appl. No. 14/100,498, 12 pages.
Notice of Allowance and Fee(s) Due mailed Oct. 8, 2015 in U.S. Appl. No. 14/100,546, 15 pages.
Non-Final Office Action mailed Sep. 14, 2015 in U.S. Appl. No. 14/103,656, 31 pages.
Notice of Allowance mailed Apr. 12, 2016 in U.S. Appl. No. 14/100,498, 12 pages.
Notice of Allowance and Fee(s) Due mailed Mar. 16, 2016 in U.S. Appl. No. 14/103,656, 23 pages.
Notice of Allowance and Fee(s) Due mailed May 6, 2015 in U.S. Appl. No. 14/100,546, 5 pages.
Non-Final Offive Action mailed Jan. 7, 2016 in U.S. Appl. No. 14/100,546, 11 pages.
International Preliminary Report on Patentability for the International Application No. PCT/US2014/043112, mailed Dec. 30, 2015, 12 pages.

* cited by examiner

|  | Previous Data | New Data Stage 0 | | New Data Stage 1 | | New Data Stage 2 | | New Data Stage 3 | | New Data Stage 4 | | New Data Stage 5 | | New Data Stage 6 | | New Data Stage 7 | |
|---|---|---|---|---|---|---|---|---|---|---|---|---|---|---|---|---|---|
| Previous State |  | 0 | 1 | 0 | 1 | 0 | 1 | 0 | 1 | 0 | 1 | 0 | 1 | 0 | 1 | 0 | 1 |
| 1111 |  |  |  |  |  |  |  |  |  |  |  |  |  |  |  |  |  |
| 1110 |  |  |  |  |  |  |  |  |  |  |  |  |  |  |  |  |  |
| 1101 |  |  |  |  |  |  |  |  |  |  |  |  |  |  |  |  |  |
| 1100 |  |  |  |  |  |  |  |  |  |  |  |  |  |  |  |  |  |
| 1011 |  |  |  |  |  |  |  |  |  |  |  |  |  |  |  |  |  |
| 1010 |  |  |  |  |  |  |  |  |  |  |  |  |  |  |  |  |  |
| 1001 |  |  |  |  |  |  |  |  |  |  |  |  |  |  |  |  |  |
| 1000 | 1 | 0000 | 0001 |  |  |  |  |  |  |  |  |  |  |  |  |  |  |
| 0111 |  |  |  |  |  |  |  |  |  |  |  |  |  |  |  |  |  |
| 0110 |  |  |  |  |  |  |  |  |  |  |  |  |  |  |  |  |  |
| 0101 |  |  |  |  |  |  |  |  |  |  |  |  |  |  |  |  |  |
| 0100 | 1 |  |  |  |  |  |  |  |  | 0000 | 0100 |  |  |  |  |  |  |
| 0011 |  |  |  |  |  |  |  |  |  |  |  |  |  |  |  |  |  |
| 0010 | 1 |  |  |  |  | 0000 | 0010 |  |  |  |  |  |  |  |  |  |  |
| 0001 | 1 | 0000 | 0001 | 0000 | 0001 | 0000 | 0010 | 0000 | 0010 | 0000 | 0100 | 0000 | 0100 | 0000 | 1000 | 0000 | 1000 |
| 0000 | 0 | 0000 | 0001 | 0000 | 0001 | 0000 | 0010 | 0000 | 0010 | 0000 | 0100 | 0000 | 0100 | 0000 | 1000 | 0000 | 1000 |

*FIG. 4*

| Previous State | Stage 1 | Stage 2 | Stage 3 | Stage 4 | Stage 5 | Stage 6 | Stage 7 | Stage 8 |
|---|---|---|---|---|---|---|---|---|
| 1,1,1,X0 | 1,1,X1,X0 | 1,X2,X1,X0 | X3,X2,X1,X0 | 1,1,X4,1 | 1,X5,X4,1 | X6,X5,X4,1 | X6,X5,X4,X7 | 1,X8,1,1 |

| Previous State | Stage 9 | Stage 10 | Stage 11 | Stage 12 | Stage 13 | Stage 14 | Stage 15 | Stage 16 |
|---|---|---|---|---|---|---|---|---|
| 1,X8,1,1 | X9,X8,1,1 | X9,X8,1,X10 | X9,X8,X11,X10 | X12,1,1,1 | X12,1,1,X13 | X12,1,X14,X13 | X12,X15,X14,X13 | 1,1,1,X16 |

*FIG. 5*

| | | New Data Stage 0 | | New Data Stage 1 | | New Data Stage 2 | | New Data Stage 3 | | New Data Stage 4 | | New Data Stage 5 | |
|---|---|---|---|---|---|---|---|---|---|---|---|---|---|
| Previous State | Previous Data | 0 | 1 | 0 | 1 | 0 | 1 | 0 | 1 | 0 | 1 | 0 | 1 |
| 1111 | 0 | 1100 | 1110 | | | | | | | | | | |
| 1110 | 1 | 1100 | 1110 | 1100 | 1000 | | | | | | | | |
| 1101 | | | | | | | | | | | | | |
| 1100 | 0 | | | 1100 | 1000 | 0000 | 1000 | | | | | | |
| 1011 | | | | | | | | | | | | | |
| 1010 | | | | | | | | | | | | | |
| 1001 | | | | | | | | | | | | | |
| 1000 | 1 | | | | | 0000 | 1000 | 1100 | 1000 | 1100 | 1110 | | |
| 0111 | | | | | | | | | | | | | |
| 0110 | | | | | | | | | | | | | |
| 0101 | | | | | | | | | | | | | |
| 0100 | | | | | | | | | | | | | |
| 0011 | | | | | | | | | | | | | |
| 0010 | | | | | | | | | 1100 | 1000 | 1100 | 1110 | 1111 | 1110 |
| 0001 | | | | | | | | | | | | | 1111 | 1110 |
| 0000 | 0 | | | | | | | | | | | | |

FIG. 6

DATA ENCODING FOR NON-VOLATILE MEMORY

CROSS-REFERENCE TO RELATED APPLICATIONS

This patent application is a continuation-in-part of and claims priority from U.S. patent application Ser. No. 14/100,546 filed Dec. 9, 2013, which is a continuation-in-part of and claims priority from U.S. patent application Ser. No. 13/921,626 filed Jun. 19, 2013, the contents of each of which is incorporated by reference herein in its entirety.

FIELD OF THE DISCLOSURE

The present disclosure is generally related to encoding data to be stored in non-volatile memory.

BACKGROUND

A popular non-volatile solid state memory in use today is flash memory (both NAND and NOR types). Flash memory is characterized by not being "write-symmetric" when writing data. To illustrate, each cell of a flash memory can be written from a value of "1" to a value of "0" independently of other cells. However, to change a cell back to a value of "1" a relatively large group of cells (called an "erase block") are set to a "1" value as a group. An erase group might contain hundreds of kilobytes or even several megabytes, and flash management systems that manage frequent updates of small chunks of data may implement relatively complex logic to preserve valid data that may be stored at other locations in the erase block.

In recent years several new "write-symmetric" non-volatile memory technologies have been introduced that do not have the non-symmetry as described for flash memory, such as Resistive RAM (also known as RRAM or ReRAM), and Magnetic RAM (also known as MRAM), as illustrative examples. In these technologies, a cell may be written in both directions—from "1" to "0" and from "0" to "1" without imposing a similar operation on cells that neighbor the cell being written.

Memory write latency may affect overall performance of computing systems, such as servers, computers, and mobile electronic devices, as illustrative examples. Improving write latency for non-volatile memory devices may result in improved system performance and an enhanced user experience.

Because errors may occur in data stored into non-volatile memory devices, such as an error due to a cell failing to change state during a write operation, error correction coding (ECC) may be used to correct errors in data read from a non-volatile memory, up to a correction capability of an ECC scheme. In some non-volatile memories, cells may become more prone to errors based on the number of times the state of the cell has been changed. Reducing a number of errors in data read from the non-volatile memory may improve read latency due to reduced ECC processing of the data, enable reduced complexity, power consumption, and cost associated with ECC processing circuitry, enable a longer useful life of the non-volatile memory device, or a combination thereof.

SUMMARY

Mapping of data to be stored in a non-volatile memory enables reduced average write time and increased average reliability of the non-volatile memory. The mapping increases the likelihood that either no storage elements change states from "1" to "0" or that no storage elements change states from "0" to "1" to improve write latency. The mapping also reduces an average number of state changes, such as from "1" to "0" or from "0" to "1", of storage elements of the non-volatile memory. The mapping may also cause the state changes to be spread substantially evenly throughout the storage elements to result in a more uniform average number of state changes among the storage elements.

BRIEF DESCRIPTION OF THE DRAWINGS

FIG. 4 is a table illustrating a particular embodiment of a mapping that may be applied to increase an average reliability at a data storage device;

FIG. 5 is a table illustrating a particular embodiment of a mapping that may be applied by the data storage device of FIG. 1 to reduce average write time and to improve reliability;

FIG. 6 is a table illustrating a particular embodiment of a mapping that may be applied by the data storage device of FIG. 1 to reduce average write time and to improve reliability;

DETAILED DESCRIPTION

Figure 1:
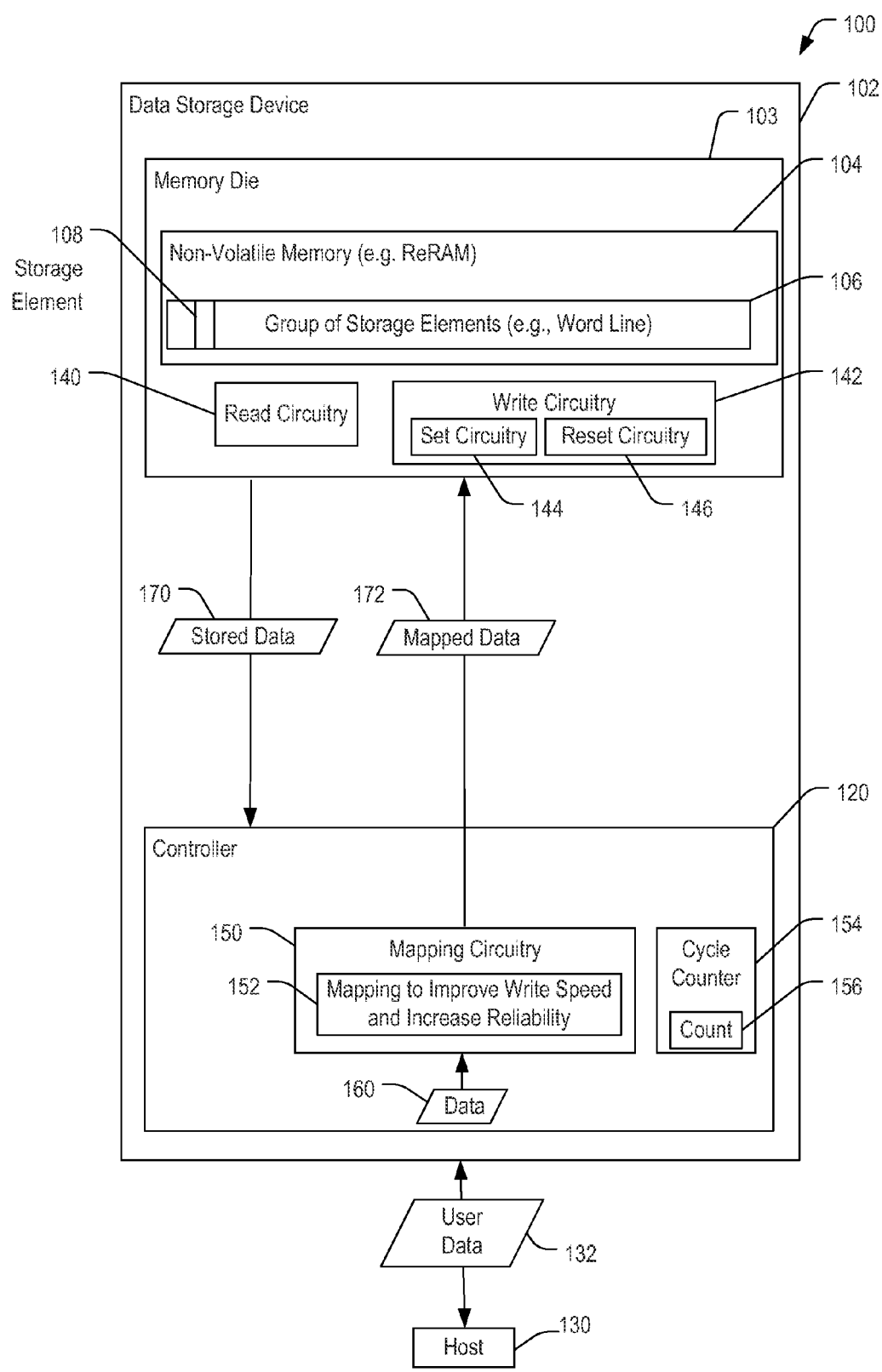
FIG. 1 is a block diagram of a particular illustrative embodiment of a system including a data storage device configured to apply a mapping to reduce average write time and increase an average reliability of a non-volatile memory.

Referring to FIG. 1, a particular embodiment of a system 100 includes a data storage device 102 coupled to an accessing device such as a host device 130. The data storage device 102 is configured to apply a mapping 152 to increase average reliability and to reduce average write time when storing data to a non-volatile memory 104.

The host device 130 may be configured to provide data, such as the user data 132, to be stored at the non-volatile memory 104 or to request data to be read from the non-volatile memory 104. For example, the host device 130 may include a mobile telephone, a music player, a video player, a gaming console, an electronic book reader, a personal digital assistant (PDA), a computer, such as a laptop computer, notebook computer, or tablet, any other electronic device, or any combination thereof. The host device 130 communicates via a memory interface that enables reading from the data storage device 102 and writing to the data storage device 102. For example, the host device 130 may operate in compliance with a Joint Electron Devices Engineering Council (JEDEC) industry specification, such as eMMC specification. As other examples, the host device 130 may operate in compliance with a universal serial bus (USB) or a universal flash storage (UFS) specification. The host device 130 may communicate with the data storage device 102 in accordance with any other suitable communication protocol.

The data storage device 102 includes the non-volatile memory 104 coupled to a controller 120. For example, the data storage device 102 may be a memory card. As another example, the data storage device 102 may be configured to be coupled to the host device 130 as embedded memory. The data storage device 102 may operate in compliance with a JEDEC industry specification. For example, the data storage device 102 may operate in compliance with a JEDEC specification, one or more other specifications, or a combination thereof.

The non-volatile memory 104 may be on a memory die 103 that is separate from the controller 120 and coupled to the controller 120 via a bus. However, in other implementations, the non-volatile memory 104 and the controller 120 may be on a common die. The non-volatile memory 104 includes a memory such as a resistive random access memory (ReRAM) that can write data to individual storage elements, such as a representative storage element 108, by changing a stored data value of "1" to "0" (e.g., a "set" operation that changes the storage element from a first state to a second state) or by changing a stored data value of "0" to "1" (e.g., a "reset" operation that changes the storage element from the second state to the first state). The non-volatile memory 104 includes a write-symmetric memory such as a write-symmetric ReRAM. The non-volatile memory 104 includes a representative group 106 of storage elements, such as a word line. The group 106 includes the representative storage element 108, such as a ReRAM cell.

Read circuitry 140 and write circuitry 142 are coupled to the non-volatile memory 104 and are configured to enable operations of reading data from storage elements of the non-volatile memory 104 and writing data to storage elements of the non-volatile memory 104, respectively. The write circuitry 142 includes set circuitry 144 that is configured to cause a "set transition" that changes a stored value in one or more selected storage elements from a "1" value to a "0" value by causing a transition from the first state to the second state. The write circuitry 142 also includes reset circuitry 146 that is configured to cause a "reset transition" that changes a stored value in one or more selected storage elements from a "0" value to a "1" value by causing a transition from the second state to the first state.

The controller 120 is configured to receive data and instructions from and to send data to the host device 130. The controller 120 is further configured to send data and commands to the non-volatile memory 104 and to receive data from the non-volatile memory 104. For example, the controller 120 is configured to send data and a write command to instruct the non-volatile memory 104 to store the data to a specified address. As another example, the controller 120 is configured to send a read command to read data from a specified address of the non-volatile memory 104.

The controller 120 includes mapping circuitry 150 that is configured to apply the mapping 152 to received data 160 (e.g., user data 132 received from the host device 130) to generate mapped data 172. The mapping 152 is configured to reduce average write time of writing data to storage elements of the non-volatile memory 104, such as to the group 106, by mapping at least one incoming data value to a mapped value such that at least one of a first operation to cause a set transition or a second operation to cause a reset transition is not required for storing the mapped value into the storage elements. Examples of application of the mapping 152 are described in further detail with respect to Tables 3-4 and FIGS. 5-6.

The mapping 152 is further configured to reduce an average number of state changes of storage elements in the non-volatile memory 104 per write operation. The mapping 152 may therefore increase an average reliability of the non-volatile memory 104 by reducing the average number of state changes. The "average reliability" of the non-volatile memory 104 is an average across multiple groups of storage elements in the non-volatile memory 104 and/or across multiple such memories. The "average number of state changes" of a storage element in a group of storage elements, such as the group 108, is an average count of state changes per write operation for that storage element for multiple write operations performed on the group. For example, the mapping 152 may be a one-to-many mapping corresponding to the coding schemes of Table 3, Table 4, FIG. 5, or FIG. 6, as illustrative, non-limiting examples.

The controller 120 also includes a cycle counter 154 configured to update a count 156 of write operations. For example, the controller 120 may be configured to send a page of data to be stored at the group 106 (e.g., where the group 106 is sized to store the page of data), and the cycle counter 154 may be configured to track a number of write operations that have been performed at the group 106. The mapping circuitry 150 may access the cycle counter 154 and apply the mapping 152 in accordance with a value of the count 156, such as described in further detail with respect to FIG. 2.

During operation, the user data 132 may be received from the host device 130 by the controller 120. For example, the user data 132 may include data to be stored at the non-volatile memory 104 and may be accompanied by a logical or physical address indicating a destination address for storage of the user data 132. The user data 132 may be addressed to be stored at the group 106 of storage elements (e.g., as a page of data that fills the group 106, or as a smaller unit of data to be stored in a portion of the group 106).

The controller 120 may provide the user data 132 to the mapping circuitry 150 as the data 160. Alternatively, the controller 120 may process the user data 132 to generate the data 160, such as by applying an error correction coding (ECC) operation. For example, the ECC operation may generate parity bits that may be combined with the user data 132 to form an ECC codeword. The ECC codeword may be provided to the mapping circuitry 150 as the data 160.

In some implementations, the mapping circuitry 150 may select the mapping 152 at least partially based on data that is already stored in the group 106 of storage elements. For example, the controller 120 may send a read command to the non-volatile memory 104 to read data stored in the group 106. In response, the non-volatile memory 104 may return stored data 170 to the controller 120. In other implementations, the mapping circuitry 150 may access the cycle counter 154 and may select the mapping 152 at least partially based on the count 156 (e.g., without reading the stored data 170).

By applying the mapping 152 to the data 160, the mapped data 172 may be more likely to be stored into the non-volatile memory 104 without using one of the set circuitry 144 or the reset circuitry 146 as compared to storing the data 160 without mapping. As a result, a write time for the mapped data 172 may be reduced as compared to storing the data 160 without mapping, as described in further detail with respect to FIG. 3. In addition, the mapped data 172 may be more likely to be stored into the non-volatile memory 104 with fewer storage elements changing state as compared to storing the data 160 without mapping. Applying the mapping 152 causes an average number of state changes of the storage elements per write operation to be reduced as compared to storing unmapped data, resulting in increased reliability of the non-volatile memory 104, as described in further detail with respect to FIG. 4.

In some implementations, the non-volatile memory 104 may be configured to write data to relatively small chunks of storage elements (such as a byte or a word) in a single write operation, while in other implementations the non-volatile memory 104 may be configured to write data to relatively large chunks of storage elements (such as pages of 2 kilobytes or 4 kilobytes). Regardless of the size of the chunk being written, a sequence of events when executing a write command may include:

a. The data storage device 102 receives a write command that specifies the address to be written and the new data chunk (e.g., the user data 132) to be stored at that address. The specified address may be a logical address or a physical address.

b. If the specified address is a logical address the data storage device 102 translates the logical address to a physical address. The data storage device 102 internally reads from the physical address in the memory 103 the currently existing data at the targeted storage elements (e.g., the stored data 170).

c. Logic in the data storage device 102 classifies the targeted storage elements into (1) storage elements that already store their target value, (2) storage elements that store a "1" and have a target value of "0", and (3) storage elements that store a "0" and have a target value of "1".

d. The data storage device 102 writes all the storage elements that store a "1" and have a target value of "0" to have the value "0" using the set circuitry 144.

e. The data storage device 102 writes all the storage elements that store a "0" and have a target value of "1" to have the value "1" using the reset circuitry 146.

Thus, a write operation may be internally translated into three memory array operations: reading before writing ("RBW"), writing the cells that need to be set to "0" (the "set pass"), and writing the cells that need to be reset to "1" (the "reset pass").

As described above and used throughout the present disclosure, a convention is adopted where a "set" operation switches a storage element from storing a "1" value to storing a "0" value, and a "reset" operation switches a storage element from storing a "0" value to storing a "1" value. However, it should be understood that the systems and methods described in the present disclosure are equally applicable to an opposite definition where the "set" operation switches a storage element from storing a "0" value to storing a "1" value and a "reset" operation switches a storage element from storing a "1" value to storing a "0" value.

In addition, the systems and methods described herein do not depend on the physical implementation of how the "set" and "reset" operations are applied to a storage element. For example, in a ReRAM memory that switches between a low-resistance state and a high-resistance state, it may be the case that "set" switches a ReRAM cell from low resistance to high resistance and "reset" switches the ReRAM cell from high resistance to low resistance. Alternatively, it may be the case that "set" switches a ReRAM cell from high resistance to low resistance and "reset" switches the ReRAM cell from low resistance to high resistance. Both alternatives are equally valid for the purposes of the present disclosure. Likewise, the systems and methods described in the present disclosure are not dependent on any particular association between a storage element's physical state (e.g., low resistance vs. high resistance) and the logical value ("0" vs. "1") stored in the storage element.

An illustrative example of the mapping 152 maps a data value having K data bits into a mapped value having N mapped bits. In the present example, N and K are positive integers and N>K. The K bits may form the entire data item to be written into the non-volatile memory 104. For example, the non-volatile memory 104 may accept write commands for individual bits (e.g., K bits), bytes (e.g., K=8*(number of bytes)), or words (e.g., K=16*(number of words)). As another example, the K bits may be a portion of a larger data chunk in which case the procedures outlined below can be applied to multiple groups of K bits that together constitute the data chunk to be written. For example, the non-volatile memory 104 may accept write commands for pages having sizes of one or more kilobytes.

N storage elements of the non-volatile memory 104 may be allocated for storing the K data bits. K data bits implies $2^K$ different data values may be stored, while N storage elements implies $2^N$ different storage states are available, where $2^N > 2^K$. Having more storage states than values enables the mapping 152 to assign multiple states to represent one or more of the data values.

For a write command, the following procedure may be performed:

1. The data storage device 102 receives a write command from the external world (e.g., from the host device 130), with the write command specifying the address to be written and the K data bits to be stored at that address (possibly as part of a larger data chunk). If the specified address is a logical address the data storage device 102 translates the logical address to a physical address.

2. The data storage device 102 reads the current contents of the N storage elements that correspond to the physical address specified for the K data bits.

3. According to the values of the K data bits and the current contents of the N storage elements (a "state" of the N storage elements), a next state of the N storage elements is determined and the N storage elements are written to represent the determined next state. This next state is selected from the multiple states assigned to represent the next value of the K data bits.

For a read command, the following procedure may be performed:

1. The data storage device 102 receives a read command from the external world (e.g., from the host device 130), with the read command specifying an address from which K data bits are to be read. If the specified address is a logical address the data storage device 102 translates the logical address to a physical address.

2. The data storage device 102 reads the contents of the N storage elements that correspond to the physical address specified for the K data bits.

3. The state of the N storage elements is translated to a value of the K data bits, which is then output to the external world (e.g., sent to the host device 102).

Figures 2, 3:
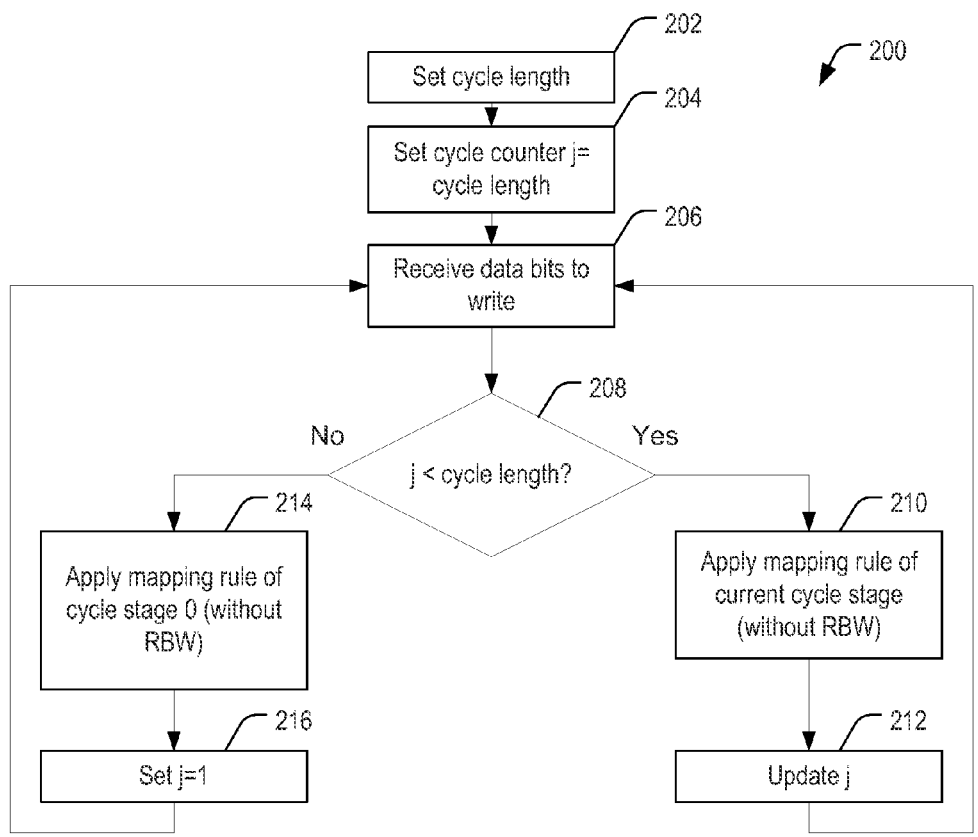
FIG. 2 is a flow chart of a particular embodiment of a method of writing data that may be performed by the data storage device of FIG. 1.
FIG. 3 is a table illustrating a particular embodiment of a mapping that may be applied to reduce average write time at a data storage device.

FIG. 2 illustrates an embodiment of a procedure that may be applied to improve the average write time and reliability of a memory based on the principles outlined above. For example, the mapping engine 150 of FIG. 1 may be configured to apply the process 200 of FIG. 2 to improve the average write time and reliability of the non-volatile memory 104. The process 200 may be applied to map incoming data values to mapped values to be stored in a memory, such as the non-volatile memory 104, where the next state of storage elements is not based on the previous state of the storage elements.

A cycle length may be set, at 202. The cycle length may correspond to a number of stages in a cycle of write operations, and a mapping may include different mapping rules corresponding to different stages of the cycle. The mapping may be configured to reduce an average number of state changes of the storage elements per write operation and to increase a number of write operations that do not require one or both of a reset pass or a set pass. A cycle counter "j" may be set to an initial value, such as equal to the cycle length, that indicates a current stage in the cycle of write operations, at 204. For example, the cycle counter may correspond to the count 156 of FIG. 1.

Data bits to write are received, at 206, and a determination is made whether the cycle count "j" is less than the cycle length, at 208. When the cycle count "j" is less than the cycle length, a mapping rule corresponding to the current stage of the cycle is applied (e.g., without performing a read before write operation), at 210, and j is updated (e.g., j=j+1), at 212. Otherwise, in response to determining that the cycle count "j" is not less than the cycle length, the mapping rule of the first stage of the cycle (e.g., stage 0) is applied (e.g., without performing a read before write operation), at 214, and j is set to 1, at 216.

The process 200 enables application of a coding scheme (i.e., the mapping) that is independent of the previous state of storage elements to determine a next state of the storage elements by allocating write operations into fixed-length cycles composed of multiple stages. Such coding schemes may include transition rules that are different for different stages. The next state of a group of storage elements may therefore be determined based on the stage number in the cycle and the new data bits (and not based on the previous state of the storage elements).

As explained above, a frequency of state transitions that do not require "reset" operations for any storage element or that do not require "set" operations for any storage element may be increased by applying a mapping as compared to storing the received data value without applying the mapping. When a state transition does not require resetting any storage elements the reset pass may be skipped, reducing the write time as compared to performing the reset pass. When a state transition does not require setting any storage elements the set pass may be skipped, reducing the write time as compared to performing the set pass. An amount of reduction of the write time may depend on the time required by the memory for the set pass, the reset pass, the reading before writing (RBW) operation, and any command handling overhead of the memory. As an illustrative example, a reduction of 20% to 40% of the write time may be obtained when comparing a one-pass write operation (e.g., set operations and no reset operations) against two-pass write operation (e.g., set operations and reset operations). Note that performing a RBW stage is not considered a "pass" for determination of whether a write operation is a one-pass or two-pass write operation. In memory devices that allow write operations (both one-pass and two-pass) to be performed without reading the storage elements before writing, write time improvements may be further enhanced by avoiding the RBW stage.

In some circumstances, the process 200 may result in faster average write times than processes that are not based on cycle length and that are instead based on the pervious state of the storage elements. For example, in a device where relatively large pages of data that contain multiple groups of N storage elements are to be written to the memory, the data written into one group of N storage elements for one page may not be the same as the data written into another group of N storage elements for the same page. Each group of N storage elements may follow a different sequence of states and as a result a cycle length for one group may differ from the cycle length of another group. As the number of groups in a single page increases, a likelihood that at least one of the groups in the page requires a two-pass write also increases. Because a write time for the page may be limited by the write time of the slowest group, a single group that requires a two-pass write may at least partially offset write time improvements attained by other groups that perform a one-pass write.

By using the cycle count, the process 200 synchronizes groups of storage elements that share a common page such that all groups start and end their cycles at the same time. This also implies that all groups have the same cycle length that is pre-determined and that is not affected by the data values being written. In the context of the process 200, the meaning of the term "cycle" is the number of iterations of the 206-208-210-212 sequence until the cycle count is reset, plus one. In addition to potential write time improvement for large data pages due to synchronization of the groups, the process 200 may also reduce write time by not performing a RBW stage before any write operation.

The reliability of a write operation (or alternatively, the probability of failure of a write operation) may be primarily dependent on the number of storage elements that change state when executing the write operation. Each change of state of a storage element introduces another opportunity for failure.

Writing random data to a memory may result in a 50% probability of a storage element changing state (e.g., via a set operation or a reset operation). Therefore, if the failure probability of each sub-operation (e.g., a set operation or a reset operation) is P, where P is a non-negative number that is not greater than 1, where P=0 indicates 0% failure probability and P=1 indicates 100% failure probability, then the probability of any storage element to be in error after a write operation (assuming the storage element was not in error before the write operation) is P/2. If a coding scheme is applied where the probability A of a storage element changing its state in a write operation is less than 0.5, then the probability of a storage element to fail in a single write operation is A*P (i.e., the product resulting from multiplying A and P together). Because A*P is less than P/2, the failure probability of a storage element is reduced as a result of the coding scheme, and the average reliability of the memory write operation is improved.

If the page size of data written to the memory is S storage elements, the probability of writing a page with zero errors is $(1-A*P)^S$.

Table 1 illustrates probabilities for writing a page of size 1 kilobyte (KB) (into 8,192 storage elements) with zero errors for different values of A and P.

TABLE 1

| A | P | $1 \times 10^{-4}$ | $1 \times 10^{-5}$ | $1 \times 10^{-6}$ |
|---|---|---|---|---|
| 50% | | 66.4% | 96.0% | 99.6% |
| 40% | | 72.1% | 96.8% | 99.7% |
| 30% | | 78.2% | 97.6% | 99.8% |
| 25% | | 81.5% | 98.0% | 99.8% |
| 12.5% | | 90.3% | 99.0% | 99.9% |

Table 2 illustrates probabilities for writing a page of size 2 KB (into 16,384 storage elements) with zero errors for different values of A and P.

TABLE 2

| A | P | $1 \times 10^{-4}$ | $1 \times 10^{-5}$ | $1 \times 10^{-6}$ |
|---|---|---|---|---|
| 50% | | 44.1% | 92.1% | 99.2% |
| 40% | | 51.9% | 93.7% | 99.3% |
| 30% | | 61.2% | 95.2% | 99.5% |
| 25% | | 66.4% | 96.0% | 99.6% |
| 12.5% | | 81.5% | 98.0% | 99.8% |

The A=50% row of Table 1 and Table 2 corresponds to random data without encoding. The other rows illustrate probabilities of performing a zero-error write operation for various values of storage element change probability A. The reliability improvement resulting from reductions in A can be substantial, especially with lower intrinsic storage element reliability illustrated by higher values of P (i.e., higher values of P, such as $P=1\times10^{-4}$, or a 1-in-10,000 probability of error, as compared to a lower value of P such as $P=1\times10^{-6}$, or a 1-in-1,000,000 probability of error).

FIG. 3 illustrates a transitions table 300 for a coding scheme where K=1 and N=4. In the coding scheme of FIG. 3, the cycle length is four. The mapping rules are dependent on the stage number in the cycle and are not dependent on the previous state. The mapping rules may be implemented as:

a) In the first stage, select state "1111" for data "0" and select state "1110" for data "1".

b) In the second stage, select state "1100" for data "0" and select state "1110" for data "1".

c) In the third stage, select state "1100" for data "0" and select state "1000" for data "1".

d) In the fourth stage, select state "0000" for data "0" and select state "1000" for data "1".

The following observations may be made regarding a group of four storage elements that store data according to the 4-bit states of the transitions table 300:

a) The probability of making a change in the left storage element of the group of storage elements is =¼*(50%+0%+0%+50%)=25%.

b) The probability of making a change in the middle-left storage element of the group of storage elements is =¼*(100%+0%+50%+50%)=50%.

c) The probability of making a change in the middle-right storage element of the group of storage elements is =¼*(100%+50%+50%+0%)=50%.

d) The probability of making a change in the right storage element of the group of storage elements is =¼*(50%+50%+0%+0%)=25%.

The overall probability of making a change in a storage element at a write operation is ¼*(25%+50%+50%+25%)=37.5%, above the theoretical lower bound of 12.5% for K=1 and N=4.

The storage element changes are not uniformly distributed, as two of the storage elements in a group have a change probability of 50%. Although some of the cycle stages of the coding scheme of FIG. 3 use set sub-operations and do not use reset sub-operations and provide a resulting increase in write speed, the coding scheme of FIG. 3 is not optimal in terms of reliability. In addition to having a 37.5% average probability of making a change in a storage element at a write operation as compared to a theoretical lower bound of 12.5%, the storage element changes are not uniformly distributed across all storage elements, with half the storage elements having a 50% change probability. This implies that no gain is achieved from endurance point of view. To illustrate, the probability of state changes of a storage element determines not only the error probability of the storage element per write operation but also the number of write operations the storage element can endure before becoming worn-out and functioning incorrectly. The larger the number of set and reset sub-operations a storage element experiences, the more the storage element becomes "worn out". Because the coding scheme of FIG. 3 results in some storage elements having 50% change probability (equal to the change probability for storing random data), an amount of wear, and therefore overall endurance, may be the same as for random data.

Other encoding schemes for K=1, N=4 can provide higher reliability. For every N and K, there is an "unused redundancy" scheme that improves reliability as compared to the unencoded random data case by not using N−K of the storage elements (so that these storage elements do not have state changes) and using the remaining K storage elements for direct (one-to-one) representation of the K data bits. This unused redundancy scheme improves the storage element change probability by a factor of K/N. The {K=1, N=4} example of this unused redundancy scheme provides an average storage element change probability A of 50%*¼=12.5%, as compared to A=37.5% in the above example.

The unused redundancy scheme introduced above results in K of the storage elements remaining at 50% change probability while the other N−K storage elements go through no state changes. Even though the average over all storage elements is 50%*K/N, the changes are not uniformly distributed across all storage elements. As a result, the K storage elements that experience the state changes wear faster than the N−K storage elements that experience no state changes and reach their end-of-life at the same rate as if no encoding was performed. Even though the unused redundancy scheme improves the average failure rate, the unused redundancy scheme does not improve the endurance of the memory. An "optimal" encoding scheme can be defined as providing a minimum theoretically possible average reliability in which storage element state changes are uniformly (or close to uniformly) distributed across all N storage elements, thus providing both failure probability improvement and endurance improvement.

FIG. 4 illustrates a transitions table 400 for a coding scheme with a cycle length of 8 and a change probability of 18.75% with changes uniformly distributed across the storage elements so as to also provide an endurance gain. This coding scheme provides no write time gain because no write operation along the cycle can be guaranteed to be a fast (one-pass) operation.

Some coding schemes, such as depicted in FIG. 3, provide write time gain but provide little or no reliability improvement. Such schemes may provide no reliability gain or may provide a modest reliability gain that is not uniformly distributed across the storage elements and thus does not improve endurance. Other coding schemes, such as depicted in FIG. 4, provide reliability and endurance gains but do not provide write time gain due to all stages using set operations and reset operations.

Table 3 illustrates an example of a coding scheme according to a first embodiment that provides write time gain (in contrast to the coding scheme of FIG. 4) and uniformly-distributed reliability gain (in contrast to the coding scheme of FIG. 3). In the coding schemes of FIGS. 3-4, for every transition in the transition table every storage element was specified as either written to "0" or as written to "1". In other words, the transition rules illustrated in the transitions tables 300 and 400 dictate the state of every storage element at any stage.

According to the first embodiment, however, a coding scheme may be defined by transition rules that may specify three alternatives for a storage element: writing the storage element to "0"; writing the storage element to "1"; or not writing the storage element and leaving the storage element in its previous state. Table 3 illustrates an example for {K=1, N=2}. Table 3 may be explained with reference to a sequence {X1, X2, . . . , Xi, . . . } of successive bits to be stored (e.g., received from the host device 130 of FIG. 1), and two storage elements {C1, C2}.

In the first stage of Table 3, if the new data bit is "0", write C1 to "0" and do not change C2. This resulting states of {C1, C2} are shown in Table 3 as "0?", where the "0" in the left position indicates that C1 is written to a "0" state and the "?" in the right position indicates that the state of C2 is unchanged. If the new data is "1", write C1 to "1" and do not change C2, shown in Table 3 as "1?".

In the second stage, if the new data bit is "0", write C1 to "0" and C2 to "1", shown in Table 3 as "01". If the new data bit is "1", write C1 to "1" and C2 to "1", shown in Table 3 as "11".

In the third stage, if the new data bit is "0", write C2 to "0" and do not change C1, shown in Table 3 as "?0". If the new data bit is "1", write C2 to "1" and do not change C1, shown in Table 3 as "?1".

In the fourth stage, if the new data bit is "0", write C2 to "0" and C1 to "1", shown in Table 3 as "10". If the new data bit is "1", write C2 to "1" and C1 to "1", shown in Table 3 as "11".

TABLE 3

| Previous | New Data-Stage 1 | | New Data-Stage 2 | | New Data-Stage 3 | | New Data-Stage 4 | |
|---|---|---|---|---|---|---|---|---|
| State | 0 | 1 | 0 | 1 | 0 | 1 | 0 | 1 |
| 1? | 0? | 1? | 01 | 11 | ?0 | ?1 | 10 | 11 |

Table 4 represents the transition rules of Table 3 with reference to the bits in the sequence {X1, X2, X3, X4, . . . , Xi, . . . }. In Table 4, X0 represents a last bit of a prior sequence that precedes X1.

TABLE 4

| Previous State | Stage 1 | Stage 2 | Stage 3 | Stage 4 |
|---|---|---|---|---|
| 1, X0 | X1, X0 | X2, 1 | X2, X3 | 1, X4 |

In Tables 3-4, the first stage and the third stage have only set operations, the second stage has set operations and reset operations, and the fourth stage has set operations and reset operations. Therefore, the coding scheme of Tables 3-4 provides write time gain because one out of each two write operations will be fast. In addition, the coding scheme of Tables 3-4 has a change probability of 37.5% that is uniformly distributed.

Another example of a coding scheme according to the first embodiment is illustrated in a transitions table 500 of FIG. 5 for {K=1, N=4}. The coding scheme of FIG. 5 has a cycle of 16 stages that may be divided into 4 sub-cycles of 4 stages. Each sub-cycle has three stages with only set operations and one stage with set operations and reset operations. The coding scheme of FIG. 5 provides the same write time gain as the {K=1, N=4} coding scheme of FIG. 3, where three out of each four write operations are one-pass operations. The coding scheme of FIG. 5 has a change probability of 21.875% that is uniformly distributed, as compared to the 37.5%, non-uniformly distributed change probability of the coding scheme of FIG. 3.

The type of coding scheme illustrated in Tables 3-4 and FIG. 5 can be extended to any {K=1, N} case for any arbitrary N. Such an extended coding scheme results in a cycle of length $N^2$ that includes N sub-cycles. Each sub-cycle has length N, and only one stage of a sub-cycle includes a reset operation. The change probability is $(2*N-1)/(2*N^2)$ and it is uniformly distributed across the storage elements. The write time gain of the {1, N} extended coding scheme is the same as the write time gain of a coding scheme generated by extending the coding scheme of FIG. 3 to {1, N}.

As an alternative to the class of coding schemes of the first embodiment that designate an unspecified data value for one or more storage elements (e.g., "?" values in Table 3) to reduce state changes, another class of schemes according to a second embodiment provides both write time and reliability gains. Coding schemes according to the second embodiment use stages that each include set operations or reset operations, and no stage includes both set operations and reset operations. For each of the stages in a cycle of such coding schemes, it is pre-determined whether the reset pass is skipped in the stage or the set pass is skipped in the stage.

FIG. 6 illustrates an example of a coding scheme according to the second embodiment. A transitions table 600 for {K=1, N=4} has a cycle of length 6. The first three stages include set operations and do not include reset operations. The last three stages include reset operations and do not include set operations.

The coding scheme of FIG. 6 provides a cell change probability of 25% that is uniformly distributed across all storage elements. The coding scheme of FIG. 6 provides an average write time of (Tset+Treset)/2, where Tset is a duration of a write operation that has a set-pass but no reset-pass, and where Treset is a duration for a write operation that has a reset-pass but no set-pass. If Tset equals Treset, the average write time of a coding scheme according to the second embodiment is shorter than the average write time of a coding scheme according to the first embodiment for the same N. If Tset does not equal Treset, a coding scheme according to the second embodiment provides a shorter average write time than a coding scheme according to the first embodiment for the same N if and only if (Tset>2*Treset−Tfull), where Tfull is a duration of a write operation that includes a set-pass and a reset-pass.

Although coding schemes to improve reliability and average write speed have been described with respect to an implementation using one-bit-per-storage element (SLC) memory devices, such coding schemes may be adjusted to be implemented using multi-bit-per-storage element (MLC) memory devices.

A group of N MLC storage elements (where N>1) each storing B bits per storage element (B>1) can function as a group of N*B SLC storage elements. Methods described herein for mapping data to be stored into a group of N*B SLC storage elements may alternatively be applied to a group of N MLC storage elements (storing B bits per storage element) to match or exceed the average write time gains and reliability gains described above in the context of SLC implementations.

To illustrate, states of two SLC storage elements may be compared to states of a single 2 bit-per-cell MLC storage element. Both configurations (2 SLC vs. 1 MLC) store two bits and have four possible states. Using the convention that the four states of the MLC storage element represent the data bit values {11,10,01,00} ordered according to their distance from the "reset" state and listed from closest to furthest, and that the two states of the SLC storage elements represent the data bits value {1,0}, it is noted that although both configurations have the same available states, in the SLC configuration the transition from "10" to "01" requires one of the cells to be set and the other to be reset. However, in the MLC configuration the transition from "10" to "01" is performed by altering the state of the storage element in the direction of the set operation. As a result, the MLC configuration should enable write performance improvement that is at least the same as the SLC configuration. The MLC configuration may enable further improved write performance in terms of the length of the cycles that may be attained.

In an MLC implementation, the change probability of a storage element is not necessarily equal to the change probability of a bit (as is the case with SLC). Minimizing the change probability of a MLC storage element includes minimizing the probability that any bit of the MLC storage element changes its value. Therefore, the assignment of bits to storage elements may be selected to achieve reduced probability that any bit stored in a MLC storage element changes its state per write operation.

A mapping to improve both average write time and reliability may be used with memory devices that write large pages at a time. For example, a page may have a size of 1 kilobyte (Kbyte) and a {K=1, N=4} mapping may be implemented using 2048 groups per page. From a host device perspective, the number of data bits stored in a page is 256 bytes because each of the 2048 groups contributes a single data bit. In this case, there might be a difference between the logical address of bits within the page and the physical address of the bits. For example, if the memory supports reading of individual bytes from a memory buffer and if a host device requests to read the last data byte in the page (logical byte 255 from the host point of view), the bytes that are to be physically read are the last four bytes in the physical page (e.g., physical bytes 1020 to 1023). The reading circuitry (e.g., read circuitry 140 of FIG. 1) may perform logical-to-physical conversions (according to the N and K values) to access the correct data. As an alternative, a memory device may be designed to implement a policy of allocating storage elements in which the first K storage elements of all groups are located sequentially starting from the beginning of the page, and the additional (N−K) storage elements are allocated for each group at the end of the page. With this policy, the translation of logical bit address to physical bit address may be performed with reduced complexity, and the reading circuitry matches the subgroups of (N−K) storage elements to their corresponding K-storage element subgroups at write time and at read time.

Figure 7:
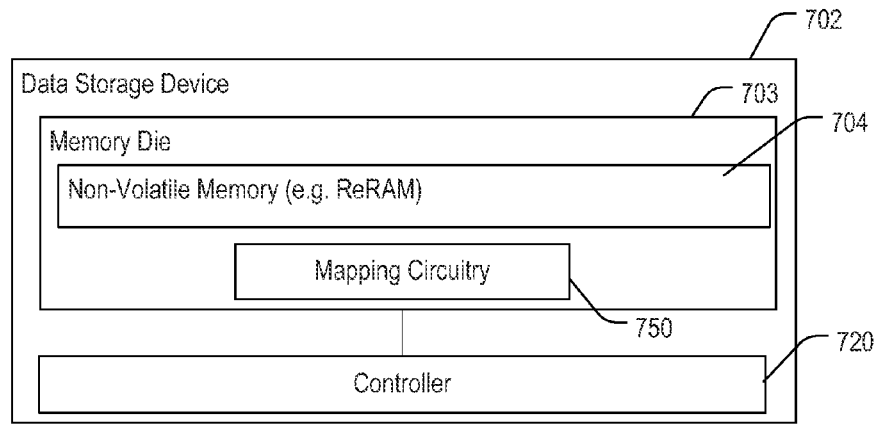
FIG. 7 is a block diagram of a embodiment of a data storage device configured to apply a mapping to reduce average write time and to increase reliability.

FIG. 7 illustrates an example of a data storage device 702 that includes a controller 720 coupled to a memory die 703. The memory die 703 includes a non-volatile memory 704 (e.g., a ReRAM) and mapping circuitry 750. The mapping circuitry 750 may be configured to operate in accordance with one or more of the methods of the present disclosure, such as according to one or more of the coding schemes of Table 3, Table 4, FIG. 5, or FIG. 6, as illustrative examples, to increase average reliability and to reduce average write time by mapping data values received from the controller 720 to mapped values. Although the controller 720 is illustrated as distinct from the memory die 703, in other implementations the controller 720 and the non-volatile memory 704 may be on a common die. By including the mapping circuitry 750 on the memory die 703, additional time savings may be achieved in implementations that perform a RBW stage by avoiding transfer of stored data to the controller 720 (e.g., the stored data 170 of FIG. 1).

Figure 8:
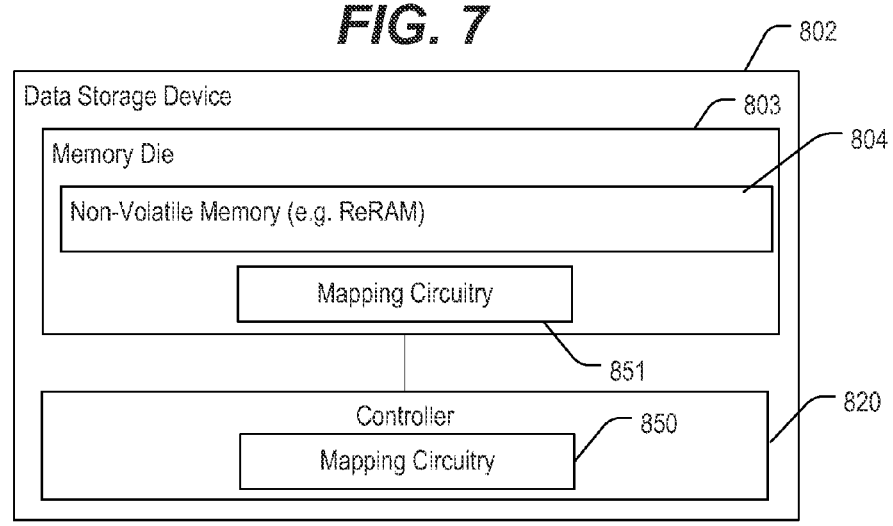
FIG. 8 is a block diagram of another embodiment of a data storage device configured to apply a mapping to reduce average write time and to increase reliability.

As another example, one or more of the methods of the present disclosure may be implemented in a controller of a memory device (e.g., by the mapping circuitry 150 of FIG. 1, in which case the non-volatile memory 104 may operate as a conventional non-volatile memory without regard for (or knowledge of) the mapping of data occurring at the controller 120). As another example, one or more of the methods of the present disclosure may be implemented by cooperation of a memory device and a memory controller. FIG. 8 illustrates an example of a data storage device 802 that includes a controller 820 coupled to a memory die 803. The controller 820 includes first mapping circuitry 850. The memory die 803 includes a non-volatile memory 804 (e.g., a ReRAM) and second mapping circuitry 851. The mapping circuitry 850 and 851 may be configured to cooperate (e.g., the second mapping circuitry 851 tracks and stores cycle counts, and the first mapping circuitry 850 determines mapped values based on the cycle counts received from the second mapping circuitry 851) to operate in accordance with one or more of the methods of the present disclosure, such as according to one or more of the coding schemes of Table 3, Table 4, FIG. 5, or FIG. 6, as illustrative examples, to increase average reliability and to reduce average write time by mapping data values received at the controller 820 to mapped values to be stored in the non-volatile memory 804. Although the controller 820 is illustrated as distinct from the memory die 803, in other implementations the controller 820 and the non-volatile memory 804 may be on a common die.

Figure 9:
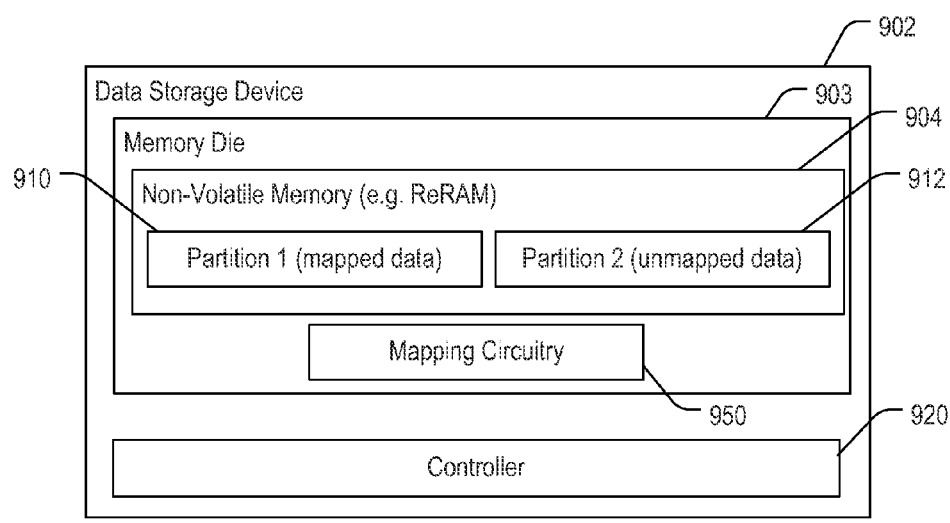
FIG. 9 is a block diagram of a particular embodiment of a data storage device configured to apply a mapping to reduce average write time and to increase reliability of a first partition of a non-volatile memory.

FIG. 9 illustrates an example of a data storage device 902 that includes a controller 920 coupled to a memory die 903. The memory die 903 includes a non-volatile memory 904 (e.g., a ReRAM) and mapping circuitry 950. The non-volatile memory 904 includes a first partition 910 and a second partition 912. The mapping circuitry 950 is configured to map received data for storage into the first partition 910 and to not map data that is received for storage into the second partition 912. The mapping circuitry 950 may be configured to operate in accordance with one or more of the methods of the present disclosure, such as according to one or more of the coding schemes of Table 3, Table 4, FIG. 5, or FIG. 6, as illustrative examples, to increase average reliability and to reduce average write time by mapping data values received from the controller 920 to mapped values.

Although the controller 920 is illustrated as distinct from the memory die 903, in other implementations the controller 920 and the non-volatile memory 904 may be on a common die. Although the mapping circuitry 950 is on the memory die 903, in other implementations the mapping circuitry 950 may be implemented on the controller 920, such as illustrated with respect to FIG. 1, or partly on the controller 920 and partly on the memory die 903, such as illustrated with respect to FIG. 8.

Methods of the present disclosure that apply a mapping that improves average write time and reduces the average number of state changes of storage elements per write operation can be implemented in a memory device, such as in the mapping circuitry 750 of FIG. 7, where the controller 720 may operate independently of the presence or absence of the mapping. Alternatively, methods of the present disclosure that apply a mapping that improves average write time and reduces the average number of state changes of storage elements per write operation can be implemented in a controller of the memory device, such as in the mapping circuitry 150 of FIG. 1, in which case the non-volatile memory 104 may operate independently of the presence or absence of the mapping. As another alternative, methods of the present disclosure that apply a mapping that improves average write time and reduces the average number of state changes of storage elements per write operation can be implemented via cooperation of a controller and the memory device, such as in the mapping circuitry 850 and 851 of FIG. 8. When implementing a scheme that includes RBW, latency may be reduced by implementing the mapping in the memory, such as illustrated with respect to FIG. 7, as compared to transferring read data to the controller and performing the mapping at the controller.

Implementations where a mapping is based on the prior state of storage elements and based on the data to be stored may avoid storing metadata, such as a cycle count, but may have reduced write speed due to multiple unsynchronized groups of storage elements in each write operation. Implementations where a mapping is based on the new data and the cycle count, such as described with respect to the coding schemes of Table 3, Table 4, FIG. 5, or FIG. 6, may track a cycle count that indicates a stage number of a cycle of write operations. There are several possibilities regarding the stage number in the cycle, including:

A. The mapping is based on the stage number in a cycle, and the stage number is retrieved from the memory together with the previous data bits without incurring a time penalty. For example, if a particular memory that is used requires RBW, a cycle count may be stored in the same page as the data bits and read as part of the RBW, incurring no additional time penalty to retrieve or to store the cycle count.

B. The mapping is based on the stage number in a cycle, and the stage number is not retrieved from the memory without incurring a time penalty. This is the case if no RBW is otherwise performed. Several options may be available in such implementations:

1. The stage number is read from the memory for each write command, incurring additional latency to read the stage number. In this case, only a few bits containing the stage number may be read rather than reading an entire page of data. In some memory types, reading a small amount of data is performed faster than reading a full page so the additional latency may be comparatively small.

2. The stage number is maintained by the controller (e.g., using the cycle counter 154 of FIG. 1). The controller may maintain a table of a current stage number for pages that are written using mapped data and may notify the memory device which stage number applies for each write command. As an example, the mapping circuitry 850 of FIG. 8 may maintain stage numbers and may send the stage number and data to the mapping circuitry 851 so that the mapping circuitry 851 can select a next state based on the stage number. The stage number may be transferred to the memory as an additional parameter to a write command, as a prefix before a write command, the prefix identifying the stage number, or by using different operation codes (opcodes) for write commands at different stages of the cycle, as illustrative examples. As an alternative implementation, the controller may perform the mapping of the data values to states (and from states to data values during read operations) and may send the mapped data, such as the mapped data 172 of FIG. 1, to the memory using standard write commands. In this case, the memory may not be "aware" of the use of mapped data and may perform standard read and write commands.

Some implementations of the disclosed systems and methods may introduce reduced device capacity while providing improved reliability and write performance A memory device manufacturer may provide a device that is pre-configured to use one or more of the methods of the present disclosure and that provides improved reliability and write performance as compared to other devices using the same memory technology (the other devices not using the methods of the present disclosure). As another example, the manufacturer may provide a device that can be configured by the user to use one or more of the methods of the present disclosure to improve reliability and write performance. Alternatively, the manufacturer may provide a device in which a portion of the storage elements operates without using one or more of the methods of the present disclosure and another portion of the storage elements uses one or more of the methods of the present disclosure. For example, the device may be a multiple-partition device in which one partition provides improved reliability and write performance, such as the first partition 910 of FIG. 9, while other partitions may provide larger exported capacity, such as the second partition 912 of FIG. 9. Alternatively, the user may be given the option to configure a partition to either use or not use one or more of the methods of the present disclosure, and optionally also to configure the partition size.

Alternatively, the user may be given the option to select, for each write command, whether or not the device should use one or more of the methods of the present disclosure (and may also specify whether to use the methods in each read operation if the memory is not configured to track which pages store mapped data). In such case, user software code executing in the host device connected to the storage device notifies the storage device whether a mapping should be performed for any write operation. The notification may be performed, for example, by using different opcodes for write with mapping and for write without mapping, by a Boolean flag parameter in the write commands indicating whether mapping should be performed, or by implementing a global flag in the memory device that is set and reset by the host software and indicates whether mapping should be performed when performing a write operation (without having to indicate this separately for each write command).

Various use cases illustrate examples where fast and reliable write operation is advantageous and a full length of a memory page can be provided for each write operation even though the stored data is smaller than a page size.

A first example of such a use case is to provide a faster write and higher reliability partition for a host device to store critical data that should not be lost. For example, such data may include data associated with the operating system state or critical data of an application running on the host device.

A second example is when memory management firmware (e.g., a flash management module) managing the internals of a storage device handles its internal control tables. Such tables might be updated frequently, creating a reliability risk with data that may be critical for the correct operation of the storage device. Such tables typically contain entries that are smaller than a page. If a table containing 512-byte entries is stored in a memory that uses 2 KB pages, one or more of the methods of the present disclosure may be used with memory blocks that contain the tables. For example, a K=1 and N=4 scheme may be used that consumes a full page for each table entry but achieves both improved write speed and improved reliability.

Figure 10:
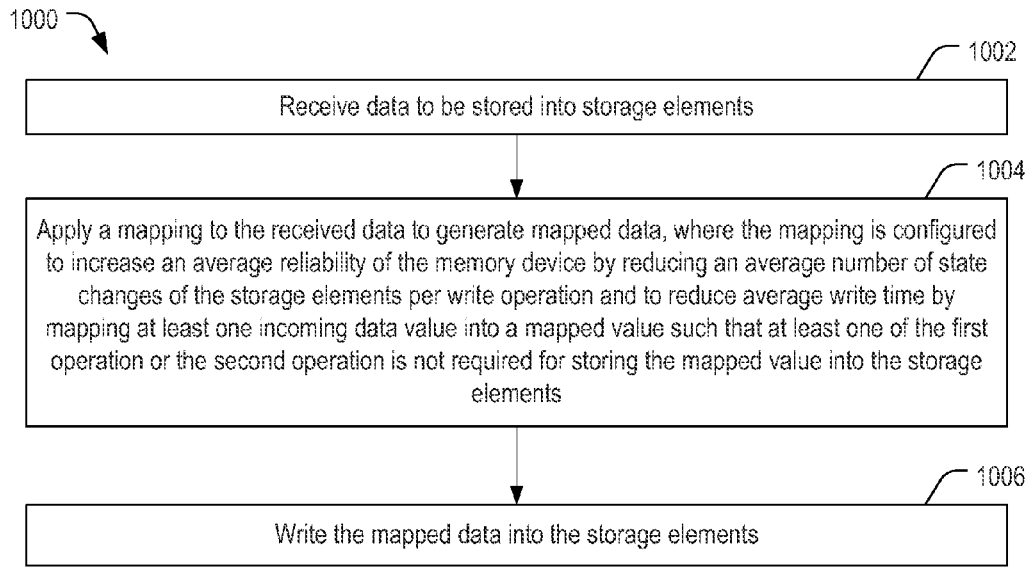
FIG. 10 is a flowchart of a particular embodiment of a method of writing data that includes a mapping configured to reduce average write time and increase an average reliability of a memory device.

FIG. 10 illustrates a particular embodiment of a method 1000 that may be performed in a memory device configured to write data to storage elements, such as in the data storage device 102 of FIG. 1. For example, the memory device may include a resistive random access memory (ReRAM). The memory device is configured to write data to the storage elements by performing at least one of a first operation on one or more first storage elements that are in a first state and a second operation on one or more second storage elements that are in a second state. The first operation changes the first state to the second state, such as a "set" operation, and the second operation changes the second state to the first state, such as a "reset" operation.

The method 1000 includes receiving data to be stored into the storage elements, at 1002. For example, the data may be the data 160 received at the mapping circuitry 150 of FIG. 1.

A mapping is applied to the received data to generate mapped data, at 1004. For example, the mapping 152 may be applied by the mapping circuitry 150 of FIG. 1. The mapped data is stored into the storage elements, at 1006.

The mapping is configured to increase an average reliability of the memory device by reducing an average number of state changes of the storage elements per write operation. The mapping is also configured to reduce average write time by mapping at least one incoming data value into a mapped value such that at least one of the first operation or the second operation is not required for storing the mapped value into the storage elements. The average reliability of the memory device is determined over multiple groups of storage elements in a device and/or over multiple devices. The average number of state changes of the storage elements per write operation is determined over multiple write operations of a same group of storage elements. The mapping may be a one-to-many mapping and may depend on a cycle count of write operations to the storage elements. Applying the mapping may include selecting a value of the mapped data based on the cycle count, such as the coding schemes of Table 3, Table 4, FIG. 5, or FIG. 6, as illustrative examples.

The mapping may be further configured to increase the average reliability by generating mapped values that result in a uniform average number of state changes per write operation among the storage elements. As used herein, "uniform average number of state changes" includes mappings where the average number of state changes per write operation for each storage element equals the average number of state changes per write operation for each other storage element. In some implementations, "uniform average number of state changes" also includes "almost-uniform" mappings where a difference in each storage element's average number of state changes per write operation as compared to each other storage element's average number of state changes per write operation is not greater than a threshold percentage, such as 10%. For example, if the threshold percentage is 10%, a mapping where a first storage element of a group has a highest average number of state changes per write operation "X" of the group and a second storage element has a lowest average number of state changes per write operation "Y" of the group would be an almost-uniform mapping if Y is greater or equal to 0.9*X.

The storage elements into which the mapped data is written may be part of a memory page that includes multiple groups of storage elements. During a write operation, the mapping of received data to mapped data may be applied to each of the multiple groups of storage elements. The cycle count may be shared by each group of the multiple groups of storage elements.

In some implementations, for at least one value of the cycle count the mapped value based on the value of the cycle count is stored into the storage elements without using one of the first operation or the second operation. To illustrate, the first and third stages of Tables 3-4, the first, second, and third stages of FIG. 5, and all stages of FIG. 6 generate mapped values that do not require the first operation or the second operation to store the mapped value.

In some implementations, applying the mapping to the received data designates an unspecified data value for one or more of the storage elements. The unspecified data value avoids a state change of the one or more of the storage elements. For example, the mapping may correspond to the coding schemes of Tables 3-4 or FIG. 5.

In other implementations, a first mapped value based on a first value of the cycle count is stored into the storage elements without using the second operation, and a second mapped value based on a second value of the cycle count is stored into the storage elements without using the first operation. For example, in the coding scheme of FIG. 6, mapped values of stages 0-2 may be stored using only set operations and mapped values of stages 3-5 may be stored using only reset operations.

Figure 11:
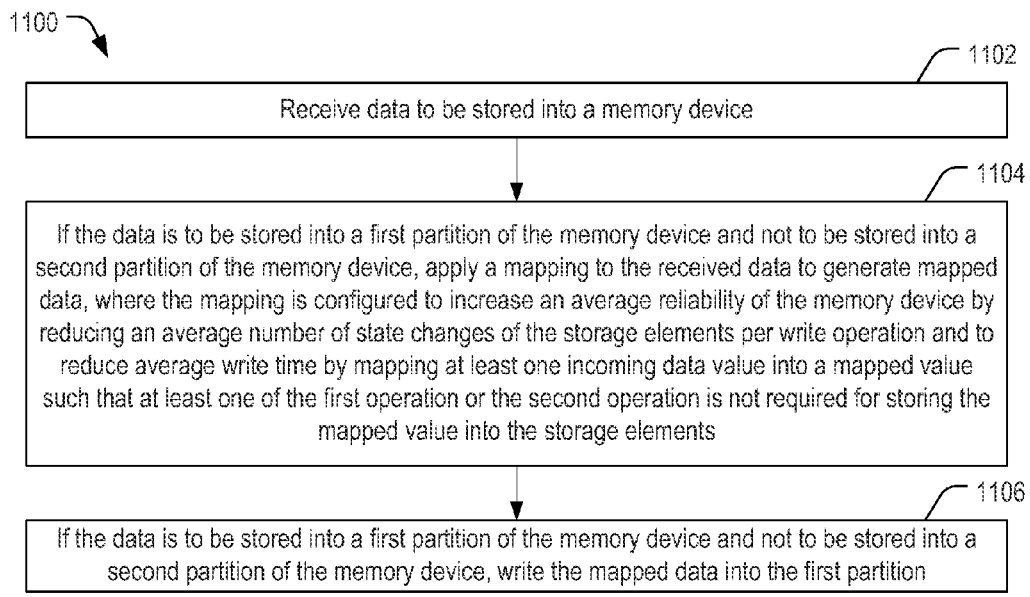
FIG. 11 is a flowchart of a particular embodiment of a method of writing data that includes a mapping configured to reduce average write time and increase an average reliability of a first partition of a memory device as compared to a second partition of the memory device.

FIG. 11 illustrates a particular embodiment of a method 1100 that may be performed in a memory device configured to write data to storage elements, such as in the data storage device 102 of FIG. 1. For example, the memory device may include a resistive random access memory (ReRAM). The memory device is configured to write data to the storage elements by performing at least one of a first operation on one or more first storage elements that are in a first state and a second operation on one or more second storage elements that are in a second state. The first operation, such as a "set" operation, changes the first state to the second state, and the second operation, such as a "reset" operation, changes the second state to the first state.

The method 1100 includes receiving data to be stored into the memory device, at 1102. For example, the data may be the data 160 received at the mapping circuitry 150 of FIG. 1.

If the data is to be stored into a first partition of the memory device and not to be stored into a second partition of the memory device, a mapping is applied to the received data to generate mapped data, at 1104, and the mapped data is written into the first partition, at 1106. For example, the first partition may be a partition of a resistive random access memory (ReRAM) and may correspond to the first partition 910 of FIG. 9. If the data is to be stored into the second partition of the memory device, the data may be written into the second partition without applying the mapping.

The mapping is configured to increase an average reliability of the first partition of the memory device by reducing an average number of state changes of the storage elements per write operation and to reduce average write time by mapping at least one incoming data value into a mapped value such that at least one of the first operation or the second operation is not required for storing the mapped value into the storage elements. The mapping may be a one-to-many mapping and may be configured to increase the average reliability by generating mapped values that result in a uniform average number of state changes per write operation among the storage elements.

The mapping of the received data to the mapped data may depend on a cycle count of write operations to the storage elements. Applying the mapping may include selecting a value of the mapped data based on the cycle count.

In some implementations, for at least one value of the cycle count the mapped value based on the value of the cycle count is stored into the storage elements without using one of the first operation or the second operation. To illustrate, the first and third stages of Tables 3-4, the first, second, and third stages of FIG. 5, and all stages of FIG. 6 generate mapped values that do not require one of the first operation (that changes storage elements in the first state to the second state) or the second operation (that changes storage elements in the second state to the first state) to store the mapped value.

In some implementations, applying the mapping to the received data designates an unspecified data value for one or more of the storage elements. The unspecified data value avoids a state change of the one or more of the storage elements. For example, the mapping may correspond to the coding schemes of Tables 3-4 or FIG. 5.

In other implementations, a first mapped value based on a first value of the cycle count is stored into the storage elements without using the second operation, and a second mapped value based on a second value of the cycle count is stored into the storage elements without using the first operation. For example, in the coding scheme of FIG. 6, mapped values of stages 0-2 may be stored using only set operations and mapped values of stages 3-5 may be stored using only reset operations.

By increasing average reliability and reducing average write time of the first partition as compared to the second partition, the first partition may be used for increased write speed and increased reliability and may store data having reduced probability of errors. The second partition may store data with reduced redundancy as compared to the first partition and may provide a higher storage density than the first partition.

Figure 12:
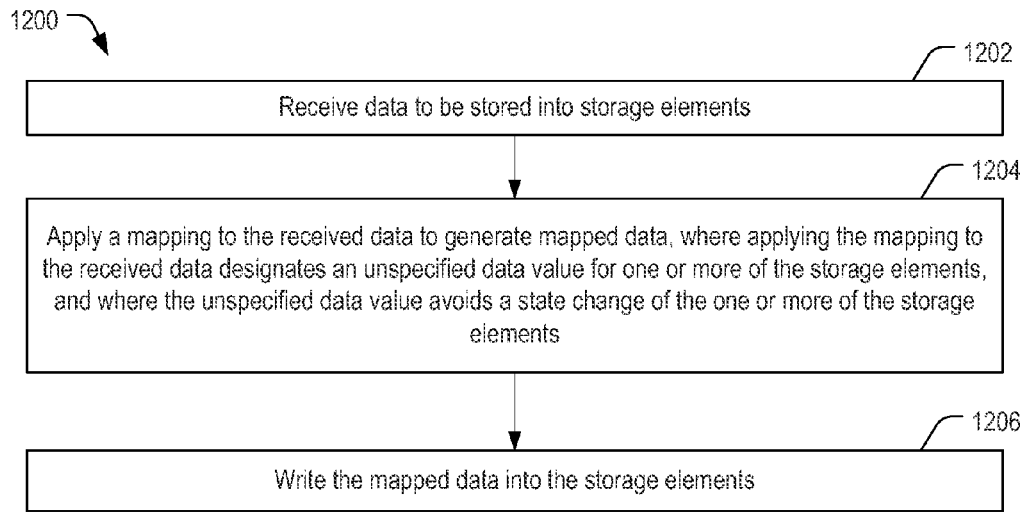
FIG. 12 is a flowchart of a particular embodiment of a method of writing data that includes a mapping that designates an unspecified value to avoid a state change of one or more storage elements at a memory device.

FIG. 12 illustrates a particular embodiment of a method 1200 that may be performed in a memory device configured to write data to storage elements, such as in the data storage device 102 of FIG. 1. For example, the memory device may include a resistive random access memory (ReRAM). The memory device is configured to write data to the storage elements by performing at least one of a first operation on one or more first storage elements that are in a first state and a second operation on one or more second storage elements that are in a second state. The first operation, such as a "set" operation, changes the first state to the second state, and the second operation, such as a "reset" operation, changes the second state to the first state.

The method 1200 includes receiving data to be stored into the storage elements, at 1202. For example, the data may be the data 160 received at the mapping circuitry 150 of FIG. 1.

A mapping is applied to the received data to generate mapped data, at 1204. For example, the mapping 152 may be applied by the mapping circuitry 150 of FIG. 1. The mapped data is stored into the storage elements, at 1206.

Applying the mapping to the received data designates an unspecified data value for one or more of the storage elements. The unspecified data value avoids a state change of the one or more of the storage elements. For example, the mapping may correspond to the coding scheme of Tables 3-4 or FIG. 5, as illustrative examples.

Figure 13:
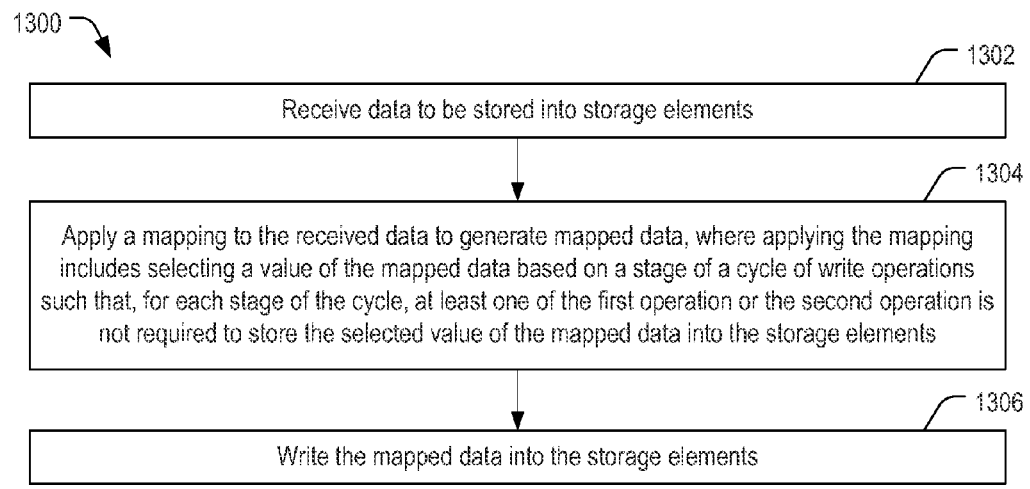
FIG. 13 is a flowchart of a particular embodiment of a method of writing data that includes a mapping configured to avoid at least one of a set operation and a reset operation when writing the data.

FIG. 13 illustrates a particular embodiment of a method 1300 that may be performed in a memory device configured to write data to storage elements, such as in the data storage device 102 of FIG. 1. For example, the memory device may include a resistive random access memory (ReRAM). The memory device is configured to write data to the storage elements by performing at least one of a first operation on one or more first storage elements that are in a first state and a second operation on one or more second storage elements that are in a second state. The first operation, such as a "set" operation, changes the first state to the second state, and the second operation, such as a "reset" operation, changes the second state to the first state.

The method 1300 includes receiving data to be stored into the storage elements, at 1302. For example, the data may be the data 160 received at the mapping circuitry 150 of FIG. 1.

A mapping is applied to the received data to generate mapped data, at 1304. For example, the mapping 152 may be applied by the mapping circuitry 150 of FIG. 1. The mapped data is stored into the storage elements, at 1306.

Applying the mapping includes selecting a value of the mapped data based on a stage of a cycle of write operations such that, for each stage of the cycle, at least one of the first operation or the second operation is not required to store the selected value of the mapped data into the storage elements. For example, the mapping may correspond to the coding scheme of FIG. 6 where mapped values of stages 0-2 may be stored using only set operations and mapped values of stages 3-5 may be stored using only reset operations.

Although various components depicted herein are illustrated as block components and described in general terms, such components may include one or more microprocessors, state machines, or other circuits configured to enable the mapping circuitry of FIGS. 1 and 7-9 to map received data values to mapped values. For example, the mapping circuitry may represent physical components, such as hardware controllers, state machines, logic circuits, or other structures, to enable the mapping circuitry to map received data values to mapped values.

The mapping circuitry may be implemented using a microprocessor or microcontroller programmed to receive data values, identify a next state of storage elements based on the received data values and a cycle count, and generate mapped values corresponding to the identified next state. In a particular embodiment, the mapping circuitry includes a processor executing instructions that are stored at the non-volatile memory 104. Alternatively, or in addition, executable instructions that are executed by the processor may be stored at a separate memory location that is not part of the non-volatile memory 104, such as at a read-only memory (ROM).

In a particular embodiment, the data storage device 102 of FIG. 1 may be attached or embedded within one or more host devices, such as within a housing of a host communication device. However, in other embodiments, the data storage device 102 may be implemented in a portable device configured to be selectively coupled to one or more external devices. For example, the data storage device 102 may be within a packaged apparatus such as a wireless telephone, a personal digital assistant (PDA), a gaming device or console, a portable navigation device, or other device that uses internal non-volatile memory.

The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments.

The above-disclosed subject matter is to be considered illustrative, and not restrictive, and the appended claims are intended to cover all such modifications, enhancements, and other embodiments, which fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method comprising:
   in a memory device configured to write data to storage elements by performing at least one of a first operation on one or more first storage elements that are in a first state and a second operation on one or more second storage elements that are in a second state, wherein the first operation changes the first state to the second state, and wherein the second operation changes the second state to the first state, performing:
   receiving data to be stored into the storage elements;
   applying a mapping to the received data to generate mapped data, wherein the mapped data differs from the received data; and
   writing the mapped data into the storage elements,
   wherein writing using the mapping is more likely to reduce write time, as compared to writing without using the mapping, by mapping at least one incoming data value into a mapped value such that at least one of the first operation or the second operation is not required for storing the mapped value into the storage elements, wherein the mapping of the received data to the mapped data depends on a cycle count of write operations to the storage elements, and wherein applying the mapping includes selecting a value of the mapped data based on a cycle length and the cycle count.

2. The method of claim 1, wherein the mapping is configured to increase an average reliability of the memory device by reducing an average number of state changes of the storage elements per write operation, and wherein the memory device includes a resistive random access memory (ReRAM).

3. The method of claim 1, wherein the mapping is configured to increase an average reliability of the memory device by generating mapped values that result in a uniform average number of state changes per write operation among the storage elements.

4. The method of claim 1, wherein the mapping is a one-to-many mapping.

5. The method of claim 1, wherein the cycle length is associated with a number of stages in a cycle of write operations, wherein the mapping is associated with mapping rules, and wherein different mapping rules correspond to different stages.

6. The method of claim 1, wherein the storage elements into which the mapped data is written are part of a memory page, wherein the memory page includes multiple groups of storage elements, and wherein during a write operation the mapping of the received data to the mapped data is applied to each of the multiple groups of storage elements.

7. The method of claim 6, wherein the cycle count is shared by each group of the multiple groups of storage elements.

8. The method of claim 1, wherein, for at least one value of the cycle count, the mapped value based on the value of the cycle count is stored into the storage elements without using one of the first operation or the second operation.

9. The method of claim 1, wherein a first mapped value based on a first value of the cycle count is stored into the storage elements without using the second operation, and wherein a second mapped value based on a second value of the cycle count is stored into the storage elements without using the first operation.

10. The method of claim 1, wherein applying the mapping to the received data designates an unspecified data value for one or more of the storage elements, and wherein the unspecified data value avoids a state change of the one or more of the storage elements.

11. A data storage device comprising:
    a controller;
    a memory device coupled to the controller and including storage elements, the memory device configured to write data to the storage elements by performing at least one of a first operation on one or more first storage elements that are in a first state and a second operation on one or more second storage elements that are in a second state, wherein the first operation changes the first state to the second state, and wherein the second operation changes the second state to the first state; and
    mapping circuitry configured, in response to receiving data to be stored into the storage elements, to apply a mapping to the received data to generate mapped data to be stored into the storage elements, the mapped data differing from the received data,
    wherein writing using the mapping is more likely to reduce write time, as compared to writing without using the mapping, by mapping at least one incoming data value into a mapped value such that at least one of the first operation or the second operation is not required for storing the mapped value into the storage elements, wherein the mapping of the received data to the mapped data depends on a cycle count of write operations to the storage elements, and wherein applying the mapping includes selecting a value of the mapped data based on a cycle length and the cycle count.

12. The data storage device of claim 11, wherein the memory device includes a resistive random access memory (ReRAM).

13. The data storage device of claim 11, wherein the mapping is a one-to-many mapping configured to increase an average reliability of the memory device by reducing an average number of state changes of the storage elements per write operation.

14. The data storage device of claim 11, wherein the cycle length is associated with a number of stages in a cycle of write operations, wherein the mapping is associated with mapping rules, and wherein different mapping rules correspond to different stages.

15. The data storage device of claim 11, wherein, for at least one value of the cycle count, the mapped value based on the value of the cycle count is stored into the storage elements without using one of the first operation or the second operation.

16. The data storage device of claim 11, wherein a first mapped value based on a first value of the cycle count is stored into the storage elements without using the second operation, and wherein a second mapped value based on a second value of the cycle count is stored into the storage elements without using the first operation.

17. The data storage device of claim 11, wherein the mapping circuitry is configured to designate an unspecified data value for one or more of the storage elements to avoid a state change of the one or more of the storage elements.

18. The data storage device of claim 11, wherein the controller includes the mapping circuitry.

19. The data storage device of claim 11, wherein the mapping circuitry is included on a memory die that includes the storage elements.

20. The data storage device of claim 11, wherein the controller includes a first portion of the mapping circuitry, and wherein a second portion of the mapping circuitry is included on a memory die that includes the storage elements.

21. A method comprising:
in a memory device configured to write data to storage elements by performing at least one of a first operation on one or more first storage elements that are in a first state and a second operation on one or more second storage elements that are in a second state, wherein the first operation changes the first state to the second state, and wherein the second operation changes the second state to the first state, performing:
receiving data to be stored into the memory device; and
if the data is to be stored into a first partition of the memory device and not to be stored into a second partition of the memory device:
applying a mapping to the received data to generate mapped data, the mapped data differing from the received data; and
writing the mapped data into the first partition,
wherein writing using the mapping is more likely to reduce write time, as compared to writing without using the mapping, by mapping at least one incoming data value into a mapped value such that at least one of the first operation or the second operation is not required for storing the mapped value into the storage elements, wherein the mapping of the received data to the mapped data depends on a cycle count of write operations to the storage elements, and wherein applying the mapping includes selecting a value of the mapped data based on a cycle length and the cycle count.

22. The method of claim 21, wherein the memory device includes a resistive random access memory (ReRAM).

23. The method of claim 21, wherein the mapping is configured to increase an average reliability of the memory device by reducing an average number of state changes of the storage elements per write operation and to increase the average reliability by generating mapped values that result in a uniform average number of state changes per write operation among the storage elements.

24. The method of claim 21, wherein the mapping is a one-to-many mapping.

25. The method of claim 21, wherein the cycle length is associated with a number of stages in a cycle of write operations, wherein the mapping is associated with mapping rules, and wherein different mapping rules correspond to different stages.

26. The method of claim 21, wherein, for at least one value of the cycle count, the mapped value based on the value of the cycle count is stored into the storage elements without using one of the first operation or the second operation.

27. The method of claim 21, wherein a first mapped value based on a first value of the cycle count is stored into the storage elements without using the second operation, and wherein a second mapped value based on a second value of the cycle count is stored into the storage elements without using the first operation.

28. The method of claim 21, wherein applying the mapping to the received data designates an unspecified data value for one or more of the storage elements, and wherein the unspecified data value avoids a state change of the one or more of the storage elements.

29. The method of claim 21, further comprising, if the data is to be stored into the second partition of the memory device, writing the data into the second partition without applying the mapping.

30. A data storage device comprising:
a controller;
a memory device coupled to the controller, wherein the memory device includes a first partition and a second partition, wherein the memory device is configured to write data to storage elements by performing at least one of a first operation on one or more first storage elements that are in a first state and a second operation on one or more second storage elements that are in a second state, wherein the first operation changes the first state to the second state, and wherein the second operation changes the second state to the first state; and
mapping circuitry configured to receive data to be stored into the memory device and, if the data is to be stored into the first partition of the memory device and not to be stored into the second partition of the memory device, to apply a mapping to the received data to generate mapped data to be written into the first partition, the mapped data differing from the received data,
wherein a write operation with the mapping is more likely to reduce write time, as compared to the write operation without the mapping, by mapping at least one incoming data value into a mapped value such that at least one of the first operation or the second operation is not required for storing the mapped value into the storage elements, wherein the mapping of the received data to the mapped data depends on a cycle count of write operations to the storage elements, and wherein applying the mapping includes selecting a value of the mapped data based on a cycle length and the cycle count.

31. The data storage device of claim 30, wherein the memory device includes a resistive random access memory (ReRAM).

32. The data storage device of claim 30, wherein the mapping is configured to increase an average reliability of the memory device by generating mapped values that result in a uniform average number of state changes per write operation among the storage elements.

33. The data storage device of claim 30, wherein the mapping is a one-to-many mapping.

34. The data storage device of claim 30, wherein the cycle length is associated with a number of stages in a cycle of write operations, wherein the mapping is associated with mapping rules, and wherein different mapping rules correspond to different stages.

35. The data storage device of claim 30, wherein, for at least one value of the cycle count, the mapped value based on the value of the cycle count is stored into the storage elements without using one of the first operation or the second operation.

36. The data storage device of claim 30, wherein a first mapped value based on a first value of the cycle count is stored into the storage elements without using the second operation, and wherein a second mapped value based on a second value of the cycle count is stored into the storage elements without using the first operation.

37. The data storage device of claim 30, wherein the mapping circuitry is configured to designate an unspecified data value for one or more of the storage elements to avoid a state change of the one or more of the storage elements.

38. The data storage device of claim 30, wherein the controller includes the mapping circuitry.

39. The data storage device of claim 30, wherein the mapping circuitry is included on a memory die that includes the storage elements.

40. The data storage device of claim 30, wherein the controller includes a first portion of the mapping circuitry, and wherein a second portion of the mapping circuitry is included on a memory die that includes the storage elements.

41. A method comprising:
in a memory device configured to write data to storage elements by performing at least one of a first operation on one or more first storage elements that are in a first state and a second operation on one or more second storage elements that are in a second state, wherein the first operation changes the first state to the second state, and wherein the second operation changes the second state to the first state, performing:
receiving data to be stored into the storage elements;
applying a mapping to the received data to generate mapped data, the mapped data differing from the received data; and
writing the mapped data into the storage elements,
wherein the mapping of the received data to the mapped data depends on a cycle count of write operations to the storage elements, wherein applying the mapping to the received data includes selecting a value of the mapped data based on a cycle length and the cycle count and designates an unspecified data value for one or more of the storage elements, and wherein during the writing the unspecified data value avoids a state change of the one or more of the storage elements.

42. A data storage device comprising:
a controller;
a memory device coupled to the controller and including storage elements, the memory device configured to write data to the storage elements by performing at least one of a first operation on one or more first storage elements that are in a first state and a second operation on one or more second storage elements that are in a second state, wherein the first operation changes the first state to the second state, and wherein the second operation changes the second state to the first state; and
mapping circuitry configured, in response to receiving data to be stored into the storage elements, to apply a mapping to the received data to generate mapped data to be stored during a write operation into the storage elements, the mapped data differing from the received data, wherein the mapping of the received data to the mapped data is based on a cycle count of write operations to the storage elements, and wherein the mapping circuitry is configured to select a value of the mapped data based on a cycle length and the cycle count and to designate an unspecified data value for one or more of the storage elements to avoid a state change of the one or more of the storage elements during the write operation.

43. A method comprising:
in a memory device configured to write data to storage elements by performing at least one of a first operation on one or more first storage elements that are in a first state and a second operation on one or more second storage elements that are in a second state, wherein the first operation changes the first state to the second state, and wherein the second operation changes the second state to the first state, performing:
receiving data to be stored into the storage elements;
applying a mapping to the received data to generate mapped data, the mapped data differing from the received data; and
writing the mapped data into the storage elements,
wherein applying the mapping includes selecting a value of the mapped data based on a cycle length and a cycle count of write operations such that, for a stage of a cycle of write operations, at least one of the first operation or the second operation is not required to store the selected value of the mapped data into the storage elements.

44. The method of claim 43, wherein the storage elements into which the mapped data is written are part of a memory page, wherein the memory page includes multiple groups of storage elements, and wherein during a write operation the mapping of the received data to the mapped data is applied to each of the multiple groups of storage elements.

45. A data storage device comprising:
a controller;
a memory device coupled to the controller and including storage elements, the memory device configured to write data to the storage elements by performing at least one of a first operation on one or more first storage elements that are in a first state and a second operation on one or more second storage elements that are in a second state, wherein the first operation changes the first state to the second state, and wherein the second operation changes the second state to the first state; and
mapping circuitry configured, in response to receiving data to be stored into the storage elements, to apply a mapping to the received data to generate mapped data to be stored into the storage elements, the mapped data differing from the received data,
wherein the mapping circuitry is configured to select a value of the mapped data based on a cycle length and a cycle count of write operations such that, for a stage of a cycle of write operations, at least one of the first operation or the second operation is not required to store the selected value of the mapped data into the storage elements.

46. The data storage device of claim 45, wherein the storage elements into which the mapped data is written are part of a memory page, wherein the memory page includes multiple groups of storage elements, and wherein during a write operation the mapping of the received data to the mapped data is applied to each of the multiple groups of storage elements.

\* \* \* \* \*